United States Patent

Hashimoto et al.

(10) Patent No.: US 11,367,994 B2
(45) Date of Patent: Jun. 21, 2022

(54) LIGHT EMITTING DEVICE

(71) Applicant: NICHIA CORPORATION, Anan (JP)

(72) Inventors: Takuya Hashimoto, Tokushima (JP); Eiichiro Okahisa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/169,224

(22) Filed: Feb. 5, 2021

(65) Prior Publication Data

US 2021/0159665 A1 May 27, 2021

Related U.S. Application Data

(63) Continuation of application No. 16/794,476, filed on Feb. 19, 2020, now Pat. No. 10,965,097, which is a
(Continued)

(51) Int. Cl.
*H01S 5/02345* (2021.01)
*H01S 5/024* (2006.01)
(Continued)

(52) U.S. Cl.
CPC .......... *H01S 5/02345* (2021.01); *H01L 24/49* (2013.01); *H01S 5/024* (2013.01);
(Continued)

(58) Field of Classification Search
CPC ......... H01L 23/02; H01L 23/04; H01L 23/06; H01L 23/08; H01L 23/10; H01L 23/12;
(Continued)

(56) References Cited

U.S. PATENT DOCUMENTS

| 5,296,724 A | 3/1994 | Ogata et al. |
| 8,013,410 B2 | 9/2011 | Imai et al. |
| (Continued) | | |

FOREIGN PATENT DOCUMENTS

| JP | 2002-270944 | 9/2002 |
| JP | 2002-289958 | 10/2002 |
| (Continued) | | |

OTHER PUBLICATIONS

Notice of Allowance on U.S. Appl. No. 16/203,477 dated Nov. 20, 2019.
(Continued)

*Primary Examiner* — David C Spalla
(74) *Attorney, Agent, or Firm* — Foley & Lardner LLP

(57) ABSTRACT

A light emitting device includes: a base including: a main body, and a frame disposed on an upper surface of the main body; one or more laser elements disposed on the upper surface of the main body and positioned inward of the frame; and a cover including: a support member that is fixed to an upper surface of the frame and that has an opening inside the frame, and a light transmissive portion that is fixed to the support member and that is disposed so as to close the opening. A first interface, between the light transmissive portion and the support member, is located inward of and lower than a second interface, between the support member and the frame. A portion of the support member that extends at least from an outermost end of the first interface to an innermost end of the second interface has a constant thickness.

19 Claims, 5 Drawing Sheets

Related U.S. Application Data continuation of application No. 16/203,477, filed on Nov. 28, 2018, now Pat. No. 10,608,406.

(51) Int. Cl.
| | |
|---|---|
| *H01L 23/00* | (2006.01) |
| *H01S 5/0222* | (2021.01) |
| *H01S 5/02253* | (2021.01) |
| *H01S 5/02257* | (2021.01) |
| *H01S 5/00* | (2006.01) |
| *H01S 5/02216* | (2021.01) |
| *H01L 33/58* | (2010.01) |
| *H01L 27/146* | (2006.01) |
| *H01L 33/48* | (2010.01) |
| *H01S 5/0225* | (2021.01) |

(52) U.S. Cl.
CPC ........ *H01S 5/0222* (2013.01); *H01S 5/02253* (2021.01); *H01S 5/02257* (2021.01); *H01L 24/45* (2013.01); *H01L 24/48* (2013.01); *H01L 27/14625* (2013.01); *H01L 33/486* (2013.01); *H01L 33/58* (2013.01); *H01L 2224/451* (2013.01); *H01L 2224/48091* (2013.01); *H01L 2224/48137* (2013.01); *H01L 2224/49109* (2013.01); *H01L 2924/1033* (2013.01); *H01L 2924/10344* (2013.01); *H01L 2924/10346* (2013.01); *H01S 5/0071* (2013.01); *H01S 5/0225* (2021.01); *H01S 5/02216* (2013.01)

(58) Field of Classification Search
CPC ......... H01L 23/13; H01L 23/14; H01L 24/45; H01L 24/48; H01L 24/49; H01L 27/14625; H01L 27/14627; H01L 31/0203; H01L 31/0232; H01L 31/02327; H01L 33/483; H01L 33/486; H01L 33/58; H01L 2224/451; H01L 2224/48091; H01L 2224/48137; H01L 2224/49109; H01S 2924/1033; H01S 2924/10344; H01S 2924/10346; H01S 5/0071; H01S 5/02216; H01S 5/0222; H01S 5/02253; H01S 5/0225; H01S 5/02257; H01S 5/02288; H01S 5/022966; H01S 5/02345; H01S 5/024

See application file for complete search history.

(56) References Cited

U.S. PATENT DOCUMENTS

| | | | |
|---|---|---|---|
| 9,746,160 B2 * | 8/2017 | Kozuru | ................. F21V 7/0083 |
| 2012/0069547 A1 | 3/2012 | Gielen et al. | |
| 2012/0091500 A1 * | 4/2012 | Matoba | ................. H01L 33/483 |
| | | | 257/E33.056 |
| 2014/0042482 A1 * | 2/2014 | Kim | ....................... H01L 33/58 |
| | | | 257/99 |
| 2014/0197528 A1 * | 7/2014 | Nagata | .................... H01L 33/58 |
| | | | 257/680 |
| 2015/0362158 A1 | 12/2015 | Igata et al. | |
| 2016/0306265 A1 * | 10/2016 | Riel | ..................... G02B 7/003 |
| 2019/0036297 A1 | 1/2019 | Gloor et al. | |
| 2019/0189861 A1 | 6/2019 | Ichinokura | |

FOREIGN PATENT DOCUMENTS

| | | |
|---|---|---|
| JP | 2016-219779 A | 12/2016 |
| WO | WO-2013/027669 | 2/2013 |

OTHER PUBLICATIONS

Non-Final Office Action on U.S. Appl. No. 16/794,476 dated Jul. 20, 2020.

Notice of Allowance on U.S. Appl. No. 16/794,476 dated Nov. 12, 2020.

\* cited by examiner

LIGHT EMITTING DEVICE

CROSS-REFERENCE TO RELATED APPLICATIONS

The present application is a continuation of U.S. patent application Ser. No. 16/794,476, filed on Feb. 19, 2020, which is a continuation of U.S. patent application Ser. No. 16/203,477, filed on Nov. 28, 2018, now U.S. Pat. No. 10,608,406, which claims priority to Japanese Patent Application No. 2017-230216, filed on Nov. 30, 2017, the disclosures of which are hereby incorporated by reference in their entireties.

BACKGROUND

The present disclosure relates to a light emitting device.

A known light emitting device includes a base, one or more semiconductor laser elements fixed on the base, a cover disposed in such a manner as to surround the semiconductor lase element, and a light transmissive member joined with the cover to close a through-hole of the cover. The cover of the light emitting device has a curved portion having a U-shape in a cross-sectional view such that the cover surrounds the through-hole in a top view. The curved portion can alleviate the deformation of the cover due to its expansion, to thereby prevent or alleviate generation of cracks on the light transmissive member See, for example, FIG. 1 in Japanese Patent Publication No. 2002-289958.

SUMMARY

There is a need for reduction of damage to the light transmissive member according to such a light emitting device.

According to one embodiment, a light emitting device includes: a base including a main body and a frame disposed on an upper surface of the main body; one or more laser elements disposed on the upper surface of the main body and positioned inward of the frame; a cover including a support member which is fixed on an upper surface of the frame and has an opening inside the frame, and a light transmissive portion disposed in such a manner as to close the opening; a lens body disposed above the light transmissive portion. The support member includes: a first portion fixed on the upper surface of the frame; a second portion, on which the lens body is disposed, positioned inward of the first portion; and positioned lower than the first portion 31a; a third portion, on which the light transmissive portion is disposed, disposed inward of the second portion, and positioned lower than the second portion. A difference between a thermal expansion coefficient of the light transmissive portion and a thermal expansion coefficient of the lens body is smaller than a difference between a thermal expansion coefficient of the light transmissive portion and a thermal expansion coefficient of the main body.

According to another embodiment, a light emitting device includes: a base including a main body and a frame disposed on an upper surface of the main body; one or more laser elements disposed on the upper surface of the main body and positioned inward of the frame; a cover including a support member which is fixed on an upper surface of the frame and has an opening inside the frame, and a light transmissive portion disposed in such a manner as to close the opening; and a lens body disposed above the light transmissive portion. The support member includes: a first step consisting of an upper surface and a lateral surface; and a second step consisting of an upper surface and a lateral surface, and positioned lower than the first step. The lens body is disposed on the upper surface of the second step of the support member. The light transmissive portion is positioned inward of the lateral surface of the second step. A lower surface of the light transmissive portion is lower than the upper surface of the second step. A difference between a thermal expansion coefficient of the light transmissive portion and a thermal expansion coefficient of the lens body is smaller than a difference between a thermal expansion coefficient of the light transmissive portion and a thermal expansion coefficient of the main body.

DETAILED DESCRIPTION

Figure 1:
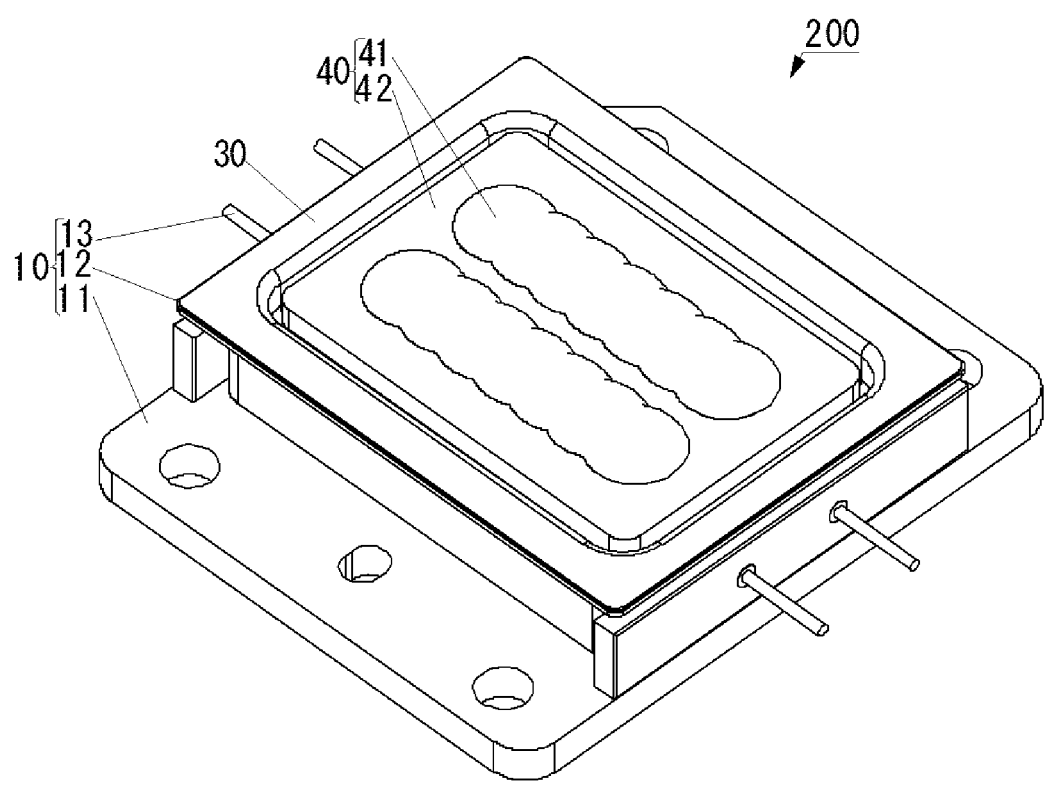
FIG. 1 shows a perspective view of a light emitting device according to certain embodiment.

Embodiments of the present invention are described below with reference to the drawings as appropriate. The embodiments herein are intended to embody the technical ideas of the present invention. However, the present invention is not limited to the described embodiments. The size, the positional relationship and the like of the members shown in the drawings may be exaggerated or omitted for the sake of clarity. In the present specification, an emission surface side of the light emitting device is referred to as an upper side (i.e., an upper side in FIG. 3), and the side opposite thereto is referred to as a lower side (i.e., a lower side in FIG. 3). A direction parallel to a direction in which lead pins 13 extend is referred to as an X direction in a top view, and a direction perpendicular to a direction in which lead pins 13 extend is referred to as a Y direction in a top view.

Figure 2:
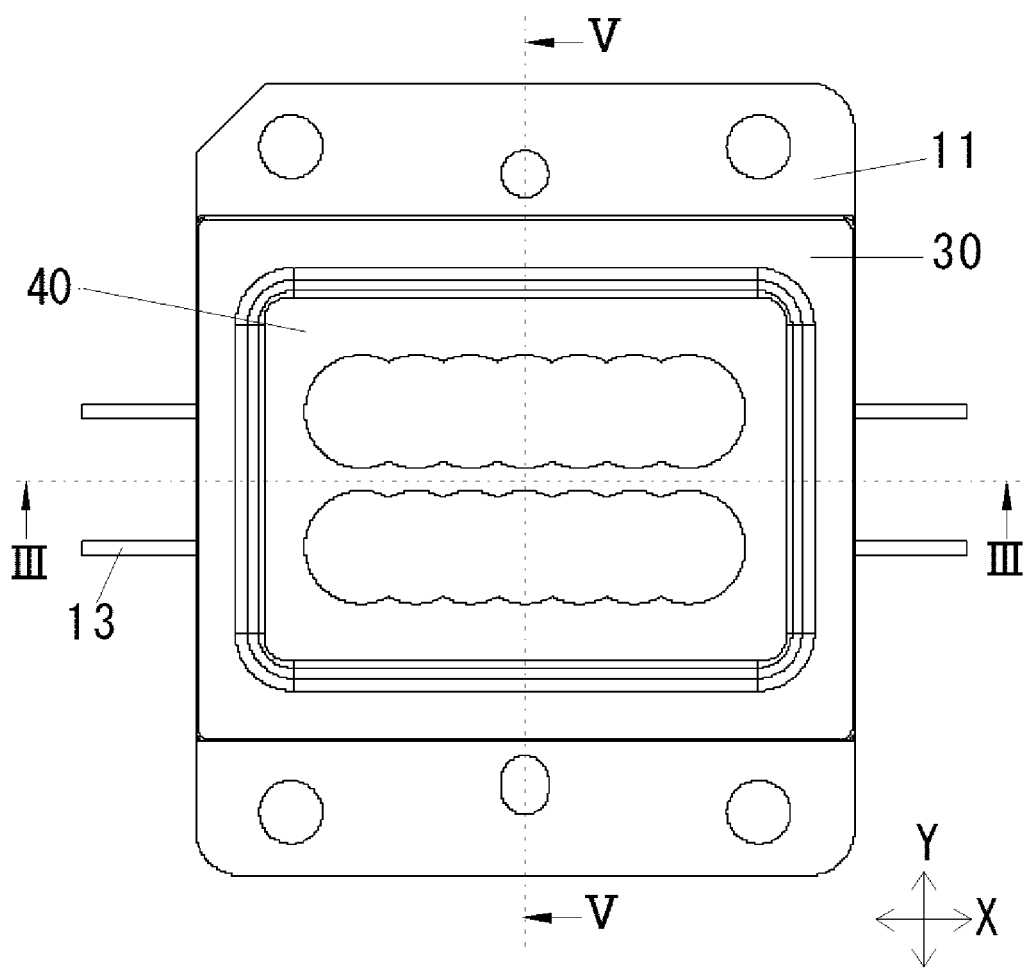
FIG. 2 shows a top view of a light emitting device according to the embodiment.
Figure 3:
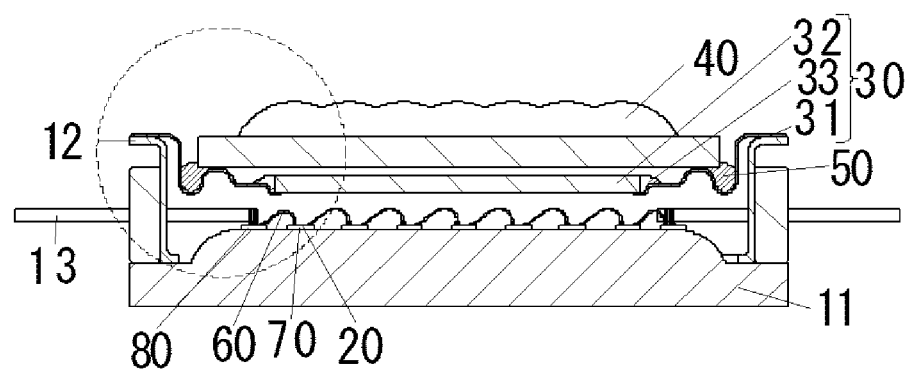
FIG. 3 shows a cross-sectional view taken along line III-III in FIG. 2.
Figure 4:
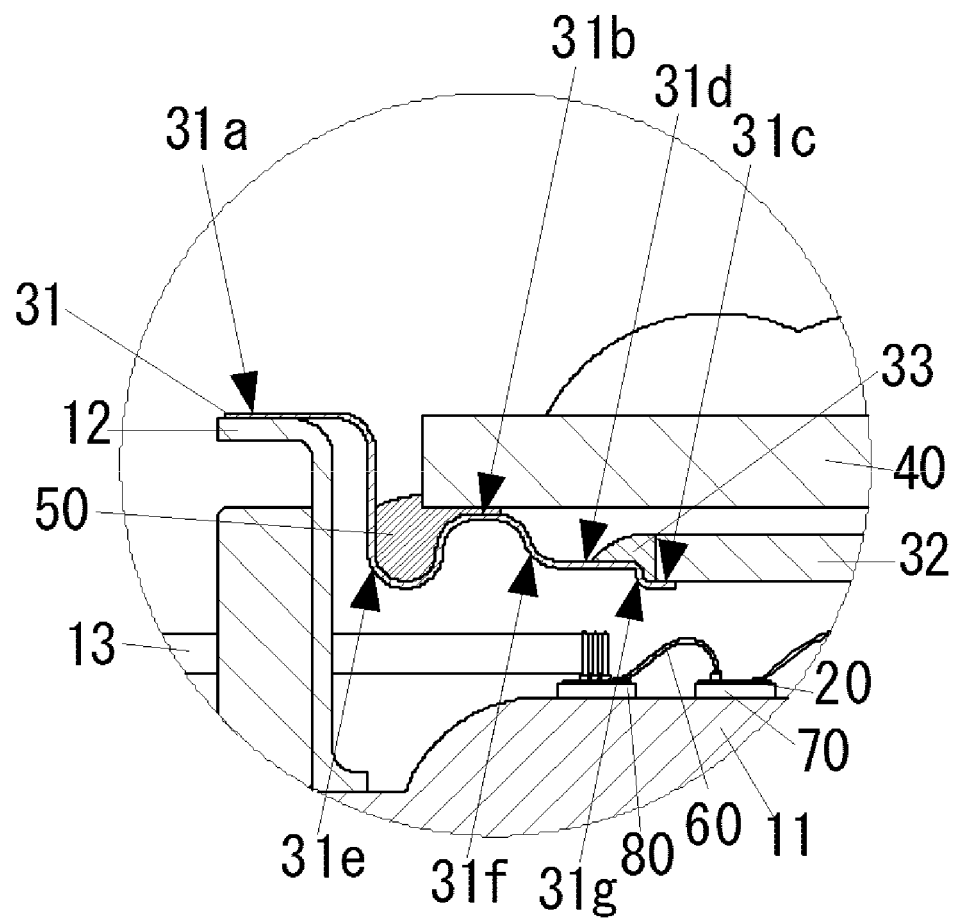
FIG. 4 shows a detail view of the portion surrounded by the dotted-line circle in FIG. 3.
Figure 5:
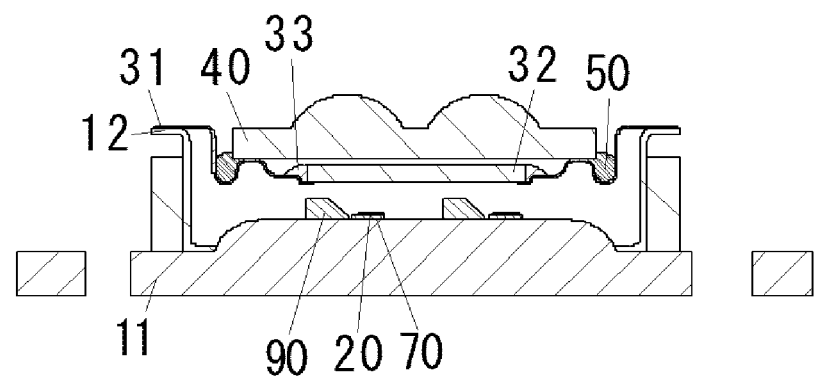
FIG. 5 shows a cross-sectional view taken along line V-V in FIG. 2.

FIG. 1 shows a perspective view of a light emitting device 200 according to the present embodiment. FIG. 2 shows a top view of the light emitting device 200. FIG. 3 shows a cross-sectional view taken along with line III-III in FIG. 2. FIG. 4 shows a detail view of the portion surrounded by the dotted-line circle in FIG. 3. FIG. 5 shows a cross-sectional view taken along line V-V in FIG. 2.

As shown in FIGS. 1 to 5, the light emitting device 200 includes a base 10, one or more laser elements 20, a cover 30, and a lens body 40. The base 10 includes a main body 11 and a frame 12 disposed on an upper surface of the main body 11. The one or more laser elements 20 are disposed on the upper surface of the main body 11 and are positioned inside the frame 12. The cover 30 includes a support member 31 and a light transmissive portion 32. The support member 31 is fixed on an upper surface of the frame 12, and an opening of the support member 31 is formed inward of the frame 12. The light transmissive portion 32 is disposed to close the opening. The lens body 40 is positioned higher than the light transmissive portion 32. In this case, the support member 31 includes a first portion 31a, a second portion 31b, and a third portion 31c. The first portion 31a is fixed on the upper surface of the frame 12. The second portion 31b on which the lens body 40 is disposed is formed inward of the first portion 31a, and positioned lower than the first portion 31a. The third portion 31c on which the light transmissive portion 32 is disposed is formed inward of the second portion 31b, and positioned lower than the second portion 31b. A difference between a thermal expansion coefficient of the light transmissive portion 32 and a thermal expansion coefficient of the lens body 40 is smaller than a difference between a thermal expansion coefficient of the light transmissive portion 32 and a thermal expansion coefficient of the main body 11.

In the light emitting device 200, damage is less likely to occur on components defining a sealed space in which the one or more laser elements are directly mounted. The components defining the sealed space include the light transmissive portion 32. A detailed explanation will be given below.

A laser element typically generates more heat than that a light emitting diode does. Thus, a laser element is generally disposed on a main body made of a material that has relatively high thermal conductivity. An example of a material of the main body having relatively high thermal conductivity includes, for example, a metal such as copper. However, such material has a thermal expansion coefficient comparatively greater than a thermal expansion coefficient of other materials. That is, the main body tends to have a thermal expansion coefficient greater than thermal expansion coefficients of other members of the light emitting device. When heat generated by operation of the laser elements transfers to the main body, the main body typically expands outward. Accordingly, the frame fixed on the main body typically expands outward, and thus the light transmissive portion 32 is easily damaged.

As the support member 31 included in the cover 31 of the light emitting device 200, the second portion 31b on which the lens body 40 is disposed is formed inward of the first portion 31a and positioned lower than the first portion 31a, and the third portion 13c on which the light transmissive portion 32 is disposed is formed inward of the second portion 31b and positioned lower than the second portion 31b. That is, the frame 12 has a plurality of steps, and the lens body 40 is disposed on a first step, and the light transmissive portion 32 is disposed on a second step positioned inward of the first step. In the light emitting device 200, the difference of thermal expansion coefficients between the light transmissive portion 32 and the lens body 40 is smaller than the difference of thermal expansion coefficients between the light transmissive portion 32 and the main body 11. With this structure, stress exerted on the light transmissive portion 32 by the lens body 40 can be reduced, to thereby reduce damage on the light transmissive portion 32.

The structural elements of the light emitting device 200 will be explained below.

Base 10

The base 10 includes the main body 11 and the frame 12 disposed on the upper surface of the main body 11.

The main body 11 is a member on which the laser elements 20 are mounted. Thus the main body is formed of material having relatively high thermal conductivity. The main body 11 of the light emitting device 200 is formed of material comprising copper as the main component. In the present specification, "comprising an element as the main component" refers to containing the element in an amount greater than 50% of the total weight. For the main body 11, copper is contained in an amount 99% or more of the total weight of the main body 11.

On the upper surface of the main body 11 in the light emitting device 200, an area where the laser elements 20 are disposed is positioned higher than an area where the frame 12 is fixed. That is, the main body that partially projects in an upward direction is used, and the laser elements 20 are disposed on an upper surface of the projected portion. This can alleviate delamination of the laser elements 20 due to warpage of the main body 11.

The frame 12 is fixed on the upper surface of the main body 11 so as to surround all of the laser elements 20 fixed on the upper surface the main body in a top view. The frame 12 preferably comprises a material having a thermal expansion coefficient close to a thermal expansion coefficient of the support member 31 of the cover 30. This can reduce damage to the light transmissive portion 32 due to heat generated by welding the frame 12 and the support member 31. The frame 12 can be formed of a material comprising, for example, iron as a main component. In the light emitting device 200, nickel-iron alloy is used for the material comprising iron as the main component. Other examples of materials comprising iron as the main component include stainless steel, Kovar, or the like. The frame 12 of the light emitting device 200 includes a first frame portion including a portion fixing the cover 30, and a second frame portion positioned on the outer lateral surfaces of the first frame portion. However, the frame 12 can include only the first frame portion.

An outer edge of the upper surface of the frame 12 has a rectangular shape in a top view. With this shape, the laser elements 20 can be linearly aligned. Thus, variance in positions of the laser elements 20 is less likely to occur. The outer edge of the upper surface of the frame 12 can have a circular shape. With this shape, stress exerted on the support member 31 can be more uniform in a whole of the support member 31, thereby reducing damage on the light transmissive portion 32. Four lead pins 13 are fixed on the frame 12. The number of the lead pins 13 can be changed depending on the number of the laser elements 20 arranged in the Y direction.

Laser Elements 20

The one or more laser elements are disposed on the upper surface of the main body of the base 10. Preferably, two or more of the laser elements 20 are disposed on the upper surface of the main body 11. In the present embodiment, the number of laser elements 20 in the light emitting device 100 is fourteen. The greater the number of the laser elements 20 is, the more heat is generated from the laser elements 20 as a whole, which is likely to cause the main body 11 to warp. Therefore, one effect of the present embodiment is that damage to the light transmissive portion 32 is relatively reduced. The number of the laser elements 20 arranged in the X direction is preferably greater than the number of the laser elements 20 arrange in the Y direction. That is, because a width of a laser beam of the laser element that is emitted from the light emitting device 100 in the X direction is narrower than width of the laser beam in the Y direction, the number of the laser elements 20 arranged on a mounting surface of the main body 11 can be increased without increasing a size of the mounting surface of the main body 11, compared to the case in which the number of the laser elements 20 arranged in the Y direction is greater than the number of the laser elements 20 arrange in the X direction.

Also, with this structure, a size of the main body 11 may not be large, so that the main body 11 is less likely to be warped.

At least one of the two or more laser elements 20 disposed on the main body 11 preferably comprises a nitride semiconductor, and more preferably, a GaN-based semiconductor. A laser element 20 comprising a GaN-based semiconductor readily collects dust. However, an amount of dust collected on the laser element 20 can be lowered by hermetic sealing. In the light emitting device 200, each of the laser elements 20 respectively includes a GaN-based semiconductor. As the GaN-based semiconductor, at least one of GaN, InGaN, and AlGaN can be used. A peak wavelength of the laser elements 20 is in a range of 420 nm to 570 nm, preferably in a range of 430 nm to 550 nm.

As shown in FIG. 3 to FIG. 5, the one or more laser elements 20 are arranged in such a manner as to emit light in a direction parallel to the upper surface of the main body 11. In other words, the laser elements 20 are arranged such that light emission end surfaces thereof are perpendicular to the upper surface of the main body 11. Accordingly, the laser elements 20 can be mounted such that the main surface thereof is parallel to the main body 11, so that heat generated from the laser elements 20 can be readily dissipated. The laser elements 20 are respectively fixed on individual submounts 70. Each of the laser elements 20 is mounted on the main body 11 via the submount 70. Accordingly, a distance between a light emission point of the end surface emitting light of each of the laser elements 20 and the upper surface of the main body 11 can be as large as a thickness of the submount 70. As the result, light emitted from the one or more laser elements 20 can be efficiently irradiated on one or more light reflective members 90 described below.

For the submounts 70, a material having a thermal expansion coefficient between a thermal expansion coefficient of the main body 11 and a thermal expansion coefficient of the laser elements 20. This can reduce delamination of the laser elements 20 or submounts 70. In the case of using a laser element comprising nitride semiconductor for the laser element 20, a submount comprising aluminum nitride or silicon carbide for the submount 70, for example. Metal film is provided on each of the submounts 70, and the laser elements 20 are each fixed on the submount 70 through a conductive layer comprising Au—Sn, or the like.

As shown in FIGS. 3 and 4, the one or more laser elements 20 are electrically connected to the lead pins 13 by wire 60 (i.e., metal fine wire). The light emitting device of the present embodiment includes submounts 80, on which no laser element 20 is disposed in such a manner as to be below and overlap the lead pins 13. Among the two or more laser elements 20 arranged in the X direction, the submount 80 disposed at one end is electrically connected to one of the laser elements 20 disposed at one end among the laser elements 20 by wire 60, and the submount 80 and one of the lead pins 13 is electrically connected by the wire 60. With this structure, a length of the wire 60 is less likely to be large, breakage of the wire 60 can be alleviated. A material of the submount 80 can be the same as or similar to the material of the submount 70.

As shown in FIG. 5, one or more light reflective members 90 are disposed on the upper surface of the main body 11 and positioned inside the frame 12. The reflective members 90 reflect light emitted from the laser elements 20 toward the light transmissive portion 32. In the present embodiment, the same number of reflective members 90 as the number of laser elements 20 are disposed on the main body 11 without interposing the submounts 70. Using the reflective members 90 can allow for a longer light path from the light emission end surfaces of the laser elements 20 to an incident surface of the lens body 40 as compared to the case in which light emitted from the laser elements directly irradiates the light transmissive part 32 without hitting on the light reflective members 90. This can reduce an effect of mispositioning the light reflective members 90 and the laser elements 20.

For the light reflective member 90, an optical element having a light reflective surface on at least one surface thereof can be used. The optical element can comprise highly heat resistant material, for example, quarts, glass such as BK7, metal such as aluminum, or Si. The light reflective surface is formed of highly reflective material comprising, for example, metal or dielectric multilayer film.

Cover 30

The cover 30 is fixed on the upper surface of the frame 12. The cover 30 includes the support member 31 in which an opening is formed inward of the frame 12 in a top view, and the light transmissive portion 32 closing the opening. In description of the cover 30 given below, a term "parallel" includes a variation of 10° or less of inclination to a reference surface, in addition to exactly parallel to the reference surface. Also, the term "perpendicular" includes variation of 10° or less of inclination to a reference surface, in addition to exactly perpendicular to the reference surface.

A material of the support member 31 can be that having comparatively low thermal conductivity for ease of welding with the frame 12. For example, a material of the frame 12 can be the same as or similar to the material for the frame 12. In the light emitting device 200, the space in which the laser elements 20 are disposed is hermetically sealed with the base 10 and the frame 30.

As shown in FIG. 4, the support member 31 includes at least the first portion 31a fixed on the upper surface of the frame 12, the second portion 31b on which the lens body 40 is disposed is provided inward of the first portion 31a and positioned lower than the first portion 31a, and the third portion 13c on which the light transmissive portion 32 is disposed is provided inward of the second portion 31b and positioned lower than the second portion 31b. As shown in FIG. 4, the first portion 31a, the second portion 31b, and the third portion 31c preferably include an area parallel to a lower surface of the frame 12. This can facilitate fixing of such portions respectively to the frame 12, the lens body 40 or the light transmissive portion 32. However, the second portion 31b may not have a flat surface area.

The support member 31 of the light emitting device 200 includes a fourth portion 31d disposed between the second portion 31b and the third portion 31c in a top view and positioned lower than the second portion 31b and higher than the third portion 31c. This can prevent or alleviate a first bonding member 33 from creeping up the second portion 31b when bonding the support member 31 and the light transmissive portion 32 with the first bonding member 33. Also, this facilitates fixing of lens body 40. The fourth portion 31d includes an area parallel to the lower surface of the main body 11. The fourth portion 31d may be absent. That is, the second portion 31b and the third portion 31c can be directly connected by a sixth portion 31f described below.

The support member 31 can have a fifth portion 31e directly connecting the first portion 31a and the second portion 31b. The fifth portion 31e of the light emitting device 200 is bent at a portion lower than the second portion 31b in such a manner as to downwardly protrude while being apart from and at a portion inward of the frame 12. In other words, the fifth portion 31e is disposed in such a manner as to extend from the first portion 31a to an area lower than the second portion 31b and be upwardly bent toward inside direction in such a manner as to be in contact with the second portion 31b while being separated from the frame 12. This configuration facilitates absorption of mechanical stress by elastic deformation at an area of the fifth portion 31e where downwardly extending. Furthermore, mechanical strength can be maintained at the area of the fifth portion 31e that is upwardly bent, thereby preventing or alleviating a damage of the lens body 40 or the light transmissive portion 32. With this structure, an amount of the second bonding member 50 excessive for connection can flow into the bent portion in the fifth portion 31e. If the second bonding member reaches the first bonding member, the second boding member may degrade because light from the laser elements hits the second bonding member. However, according to the light emitting device 200, the second bonding member 50 is positioned closer to the outer edge, so that the second bonding member 50 is less likely to enter inside of the light emitting device 200 and to reach the first bonding member 33. A length of the fifth portion 31e from an upper most portion to a lowest portion thereof can be, for example, 1.5 mm to 4 mm. The lowermost portion of the fifth portion 31e is preferably at a position lower than a lowermost portion of the third portion 31c. With this structure, the uppermost portion to the lowermost portion of the fifth portion 31e can be longer, so that stress can be easily absorbed.

The support member 31 has a sixth portion 31f between the second portion 31b and the fourth portion 31d. The sixth portion 31f includes an inclined portion that becomes wider from an inside to an outside of the light emitting device 200. In this case, the inclined portion of the sixth portion 31 is preferably inclined at an angle in a range of 0° to 30° with respect to a surface perpendicular to the lower surface of the main body 11. Accordingly, the sixth portion 61f directly connecting the fourth portion 31d and the second portion 31b can be sharply inclined, resulting in preventing or alleviating creep-up of the first bonding member 33 on the second portion 31b.

The support member 31 has a seventh portion 31g directly connecting between the third portion 31c and the fourth portion 31d to facilitate positioning the light transmissive portion 32. The seventh portion 31g preferably includes an inclined portion inclining at an angle in a range of 0° to 15° with respect to the surface perpendicular to the lower surface of the main body 11. This can alleviate creep-up of the first bonding member 33 on the fourth portion 31d.

The support member 31 preferably has a relatively smaller and constant thickness. In other words, the support member 31 preferably has a thin plate shape. Accordingly, the support member 31 can be manufactured by press work which can reduce manufacturing cost. For example, the support member has a thickness in a range of 0.03 mm to 0.2 mm, and preferably in a range of 0.05 mm to 0.15 mm, as a whole. The support member 31 in the light emitting device 200 has a constant thickness except for at least an area of the support member 31 that is fixed on the frame 12. In other words, each of the second portion 31b to the seventh portion 31g has substantially the same thickness. The first portion 31a is fixed to the frame 12 by welding, and the fixed portion by welding may be small in thickness. The thicknesses of the first portion 31a, the second portion 31b and the fourth portion 31d refer to a length in an up-and-down direction perpendicular to a right-and-left direction at a portion extending in the right-and-left direction. The thicknesses of the fifth portion 31e, the sixth portion 31f and the seventh portion 31g refer to a length in the right-and-left direction perpendicular to the up-and-down direction at a portion extending in the up-and-down direction. The term "the same thickness" herein includes a tolerance of about ±10%.

The light transmissive portion 32 is fixed to the third portion 31c to close the opening of the support member 31. In the present embodiment, the light transmissive portion 32 is fixed on the upper surface of the third portion 31c, an outer edge of the light transmissive portion 32 is positioned outward of an outer edge of the opening in a top view.

The light transmissive portion 32 of the light emitting device 200 is formed of material comprising glass. Alternatively, the light transmissive portion 32 can be formed of material comprising sapphire. The light transmissive portion 32 preferably has a thickness (i.e., length in the up-and-down direction) in a range of 0.5 mm to 1 mm. Setting the thickness to aforementioned lower limit or greater can maintain a mechanical strength of the light transmissive portion 32. Setting the thickness to the aforementioned upper limit or smaller can make a distance between the light reflective member 90 and the lens body 40 smaller.

The light transmissive portion 32 is fixed on the support member 31 with the first bonding member 33. For the first bonding member 33, material having a thermal expansion coefficient close to the thermal expansion coefficients of the light transmissive portion 32 and the support member 31. The first bonding member 33 is preferably formed of material comprising inorganic material in order to reduce dust collection on the laser element 20. The first bonding member 33 is formed of material comprising, for example, lower melting point glass.

Lens Body 40

Figure 6:
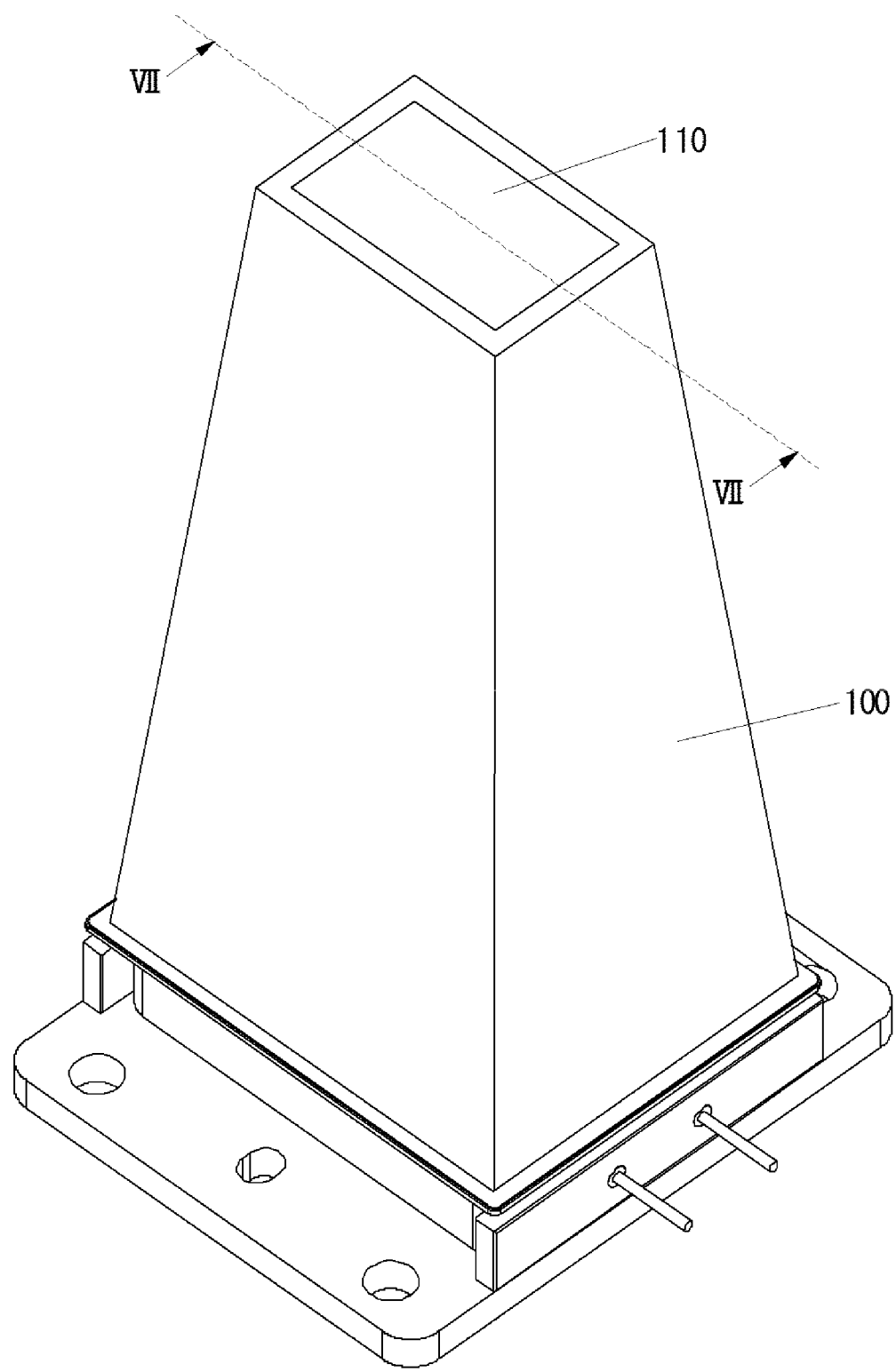
FIG. 6 shows a perspective view of a light emitting device including a light-guide member and a cover.
Figure 7:
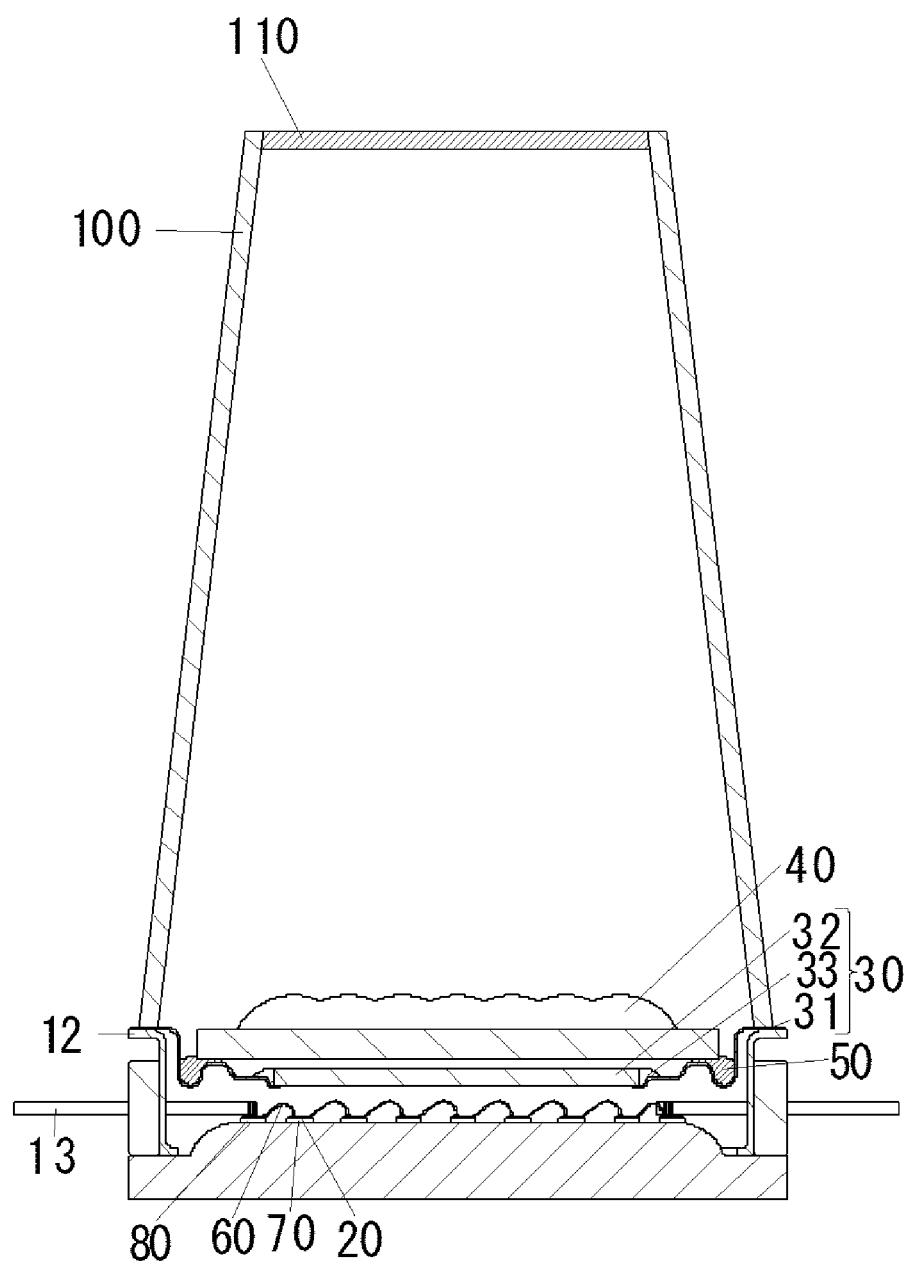
FIG. 7 shows a cross-sectional view taken along line VII-VII in FIG. 6.

The lens body 40 is positioned away from the light transmissive portion 32, and controls light distribution of light form the one or more laser elements 20. The lens body 40 is fixed at an area inward of an inner edge of the first portion 31a of the support member 31. This can facilitate fixing other components on the upper surface of the first portion 31a. For example, as shown in FIG. 6 and FIG. 7, a light guide member 100 having a frustum shape is fixed on the upper surface of the first portion 31a, and an end of the light guide member 100 can be covered with a lid 110, in order to reduce dust collection on the lens body 40. In other words, a first end of the light guide member 100 is fixed to the first portion 31a, and a second end of the light guide member 100 that is opposite the first end is fixed to the lid 110. With this structure, comparatively large dust is less likely to adhere to the lens body 40. A space defined by fixing the support member 31, the light guide member 100 and the lid 110 is preferably hermetically sealed. This can prevent or alleviate relatively small dust from entering a space where the lens body 40 is to be disposed, thereby improving the reliability of the light emitting device 200.

A hollow frustum shaped component is employed for the light guide member 100 of the light emitting device 200. Alternatively, the light guide member 100 can be a hollow rectangular prism, a hollow cylindrical shape, or the like. The light guide member 100 can have a width defined in the main body side in an upward direction. As shown in FIG. 6 and FIG. 7, the width of the light guide member 100 can become narrower from the first end toward the second end of the light guide member. However, the light guide member can have the same width of the hollow portion thereof from the first end to the second end, or can have a width that becomes wider from the first end toward the second end thereof. The lid 110 can be formed of a material comprising light transmissive material such as glass or sapphire. In the hollow space defined by the support member 31, the light guide member 100 and the lid 110, components such as a wavelength conversion member or a lens body can be disposed.

For the lens body 40 in the light emitting device 200, a collimator lens body with which light passing through lenses 41 of the lens body 40 becomes close to parallel light. The collimator lens referred herein includes one with which light passing through the lenses 41 becomes exactly parallel light.

The thermal expansion coefficient difference between the lens body 40 and the light transmissive portion 32 is preferably as small as possible to prevent or alleviate damaging the light transmissive portion 32. The thermal expansion coefficient difference between the lens body 40 and the light transmissive portion 32 can be, for example, $5\times10^{-6}/°$ C. or less, and preferably $2\times10^{-6}/°$ C. or less. Examples of components for the lens body 40 can include glass such as B270 or BK7 (i.e., borosilicate glass) manufactured by Schott AG, or the like.

As shown in FIG. 2, the lens body 40 has the plurality of lenses 41, and non-lens portion surrounding the lenses 41, in a top view. In the present embodiment, the plurality of lenses 41 and the non-lens portion 42 are integrally formed by the same material. As shown in FIG. 4, the non-lens portion 42 is connected to the second portion 31b with the second bonding member 50. With this structure, the lens body 40 can be fixed to the support member 31, while preventing or alleviating laser beam from irradiating the second bonding member 50. The second portion 31b is positioned along an inner edge of the frame 12, and the lens body 40 is fixed to the second portion 31b with a frame shape, in a top view. In other words, the lens body 40 is fixed to the support member 31 to be positioned inward of the frame 12 in any cross-sectional view in the up-and-down direction of the light emitting device 200. With this structure, if the frame 12 is pulled to extend in outward direction, the expansion can be prevented or alleviated by the lens body 40, whereby the light transmissive portion 32 is less likely to be damaged. For the lens body 40, components of the lenses 41 and the non-lens portion 42 are formed of different materials while having a thermal expansion coefficient close to the thermal expansion coefficient of the light transmissive portion 32 as a whole of the lens body 40.

One of the lenses 41 is continuously positioned to an adjacent one of the lenses 41 in a direction in which expansion of laser beam is narrower. The lenses 41 are continuously positioned in the X direction. This can reduce the size of the lens body 40 resulting in reducing the size of the light emitting device 200 as a whole.

The second bonding member 50 is preferably formed using material having a Young's modulus smaller than a Young's modulus of the first bonding member 33. The second bonding member 50 is likely to be subjected to stress because the second bonding member 50 is positioned closer to the frame 12 than the first bonding member 33. However, use of material having a smaller Young's modulus can prevent or alleviate damage on the second bonding member 50 or lens body 40. A material of the second bonding member 50 preferably comprises resin material, more preferably, ultra-violet curable resin. Use of ultra-violet curable resin can eliminate consideration of the time required for the second bonding member 50 to be cured, when position of the lens body 40 is adjusted. Thus, the position of the lens body 40 can be easily adjusted in an accurate manner. As shown in FIG. 4, the second bonding member 50 is in contact with the fifth portion 31e of the support member 31 functioning as stress relief. However, the second bonding member 50 can be only on the second portion 31b. Accordingly, even in the case where the second bonding member 50 is in contact with the fifth portion 31e, it is considered that an effect of stress relief on the fifth portion 31e can be realized because material having a smaller Young's modulus is used for the second bonding member 50.

The light emitting device according to the present embodiment can be used for a projector, or the like.

What is claimed is:

1. A light emitting device comprising:
    a base comprising:
        a main body, and
        a frame disposed on an upper surface of the main body;
    one or more laser elements disposed on the upper surface of the main body and positioned inward of the frame; and
    a cover comprising:
        a support member that is fixed to an upper surface of the frame and that has an opening inside the frame, and
        a light transmissive portion that is fixed to the support member and that is disposed so as to close the opening;
    wherein a first interface, between the light transmissive portion and the support member, is located inward of and lower than a second interface, between the support member and the frame, and
    wherein a portion of the support member that extends at least from an outermost end of the first interface to an innermost end of the second interface has a constant thickness.

2. The light emitting device according to claim 1, further comprising:
    a lens body that is disposed on the support member such that the lens body is above the light transmissive portion.

3. The light emitting device according to claim 2, wherein:
    a difference between a thermal expansion coefficient of the light transmissive portion and a thermal expansion coefficient of the lens body is smaller than a difference between the thermal expansion coefficient of the light transmissive portion and a thermal expansion coefficient of the main body.

4. The light emitting device according to claim 1, wherein:
    a thermal expansion coefficient of the frame is closer to a thermal expansion coefficient of the support member than to the thermal expansion coefficient of the main body.

5. The light emitting device according to claim 1, wherein:
    the main body is formed of material comprising copper as a main component, and
    the frame is formed of a material comprising iron as a main component.

6. The light emitting device according to claim 1, wherein:
    the one or more laser elements comprise two or more laser elements disposed on the upper surface of the main body.

7. The light emitting device according to claim 3, wherein:
    the light transmissive portion is fixed to the support member via a first bonding member,
    the lens body is fixed to the support member via a second bonding member, and and a Young's modulus of the second bonding member is smaller than a Young's modulus of the first bonding member.

8. The light emitting device according to claim 7, wherein:
the first bonding member is formed of a material comprising glass, and
the second bonding member is formed of a material comprising a resin.

9. The light emitting device according to claim 1, further comprising:
a light guide member having a first end that is fixed to an upper surface of a first portion of the cover; and
a lid that is fixed to a second end of the light guide member so as to close the second end of the light guide member.

10. The light emitting device according to claim 1, wherein:
a thickness of at least a first part of a portion of the support member that is located at the second interface is less than the thickness of the portion of the support member that extends from the outermost end of the first interface to the innermost end of the second interface.

11. The light emitting device according to claim 2, wherein:
a thickness of at least a first part of a portion of the support member that is located at the second interface is less than the thickness of the portion of the support member that extends from the outermost end of the first interface to the innermost end of the second interface.

12. The light emitting device according to claim 3, wherein:
a thickness of at least a first part of a portion of the support member that is located at the second interface is less than the thickness of the portion of the support member that extends from the outermost end of the first interface to the innermost end of the second interface.

13. The light emitting device according to claim 4, wherein:
a thickness of at least a first part of a portion of the support member that is located at the second interface is less than the thickness of the portion of the support member that extends from the outermost end of the first interface to the innermost end of the second interface.

14. The light emitting device according to claim 10, wherein:
a thickness of a second part of a portion of the support member that is located at the second interface is the same as the thickness of the portion of the support member that extends from the outermost end of the first interface to the innermost end of the second interface.

15. The light emitting device according to claim 11, wherein:
a thickness of a second part of a portion of the support member that is located at the second interface is the same as the thickness of the portion of the support member that extends from the outermost end of the first interface to the innermost end of the second interface.

16. The light emitting device according to claim 12, wherein:
a thickness of a second part of a portion of the support member that is located at the second interface is the same as the thickness of the portion of the support member that extends from the outermost end of the first interface to the innermost end of the second interface.

17. The light emitting device according to claim 13, wherein:
a thickness of a second part of a portion of the support member that is located at the second interface is the same as the thickness of the portion of the support member that extends from the outermost end of the first interface to the innermost end of the second interface.

18. The light emitting device according to claim 1, wherein:
a thickness of the portion of the support member that extends from the outermost end of the first interface to the innermost end of the second interface is in a range of 0.03 mm to 0.2 mm.

19. The light emitting device according to claim 8, wherein:
the glass of the first bonding member is low melting point glass, and
the resin of the second bonding member is ultraviolet curable resin.

* * * * *